United States Patent [19]

Matsuo et al.

[11] Patent Number: 4,551,683
[45] Date of Patent: Nov. 5, 1985

[54] SWITCHED CAPACITOR FILTER CIRCUIT

[75] Inventors: Kenji Matsuo, Yokohama; Shouji Abou, Kawasaki, both of Japan

[73] Assignee: Tokyo Shibaura Denki Kabushiki Kaisha, Japan

[21] Appl. No.: 553,022

[22] Filed: Nov. 17, 1983

[30] Foreign Application Priority Data

Nov. 19, 1982 [JP] Japan ................. 57-202946
Nov. 19, 1982 [JP] Japan ................. 57-202954

[51] Int. Cl.$^4$ ............... H03H 11/40; H03F 1/34; H03K 3/013; H03K 17/693
[52] U.S. Cl. .................... 328/167; 328/127; 330/107; 330/109; 333/213; 333/173; 307/520
[58] Field of Search .......... 328/127, 165, 167; 330/107, 109, 9; 333/173, 213, 216, 217, 19; 307/352, 353, 520, 521

[56] References Cited

U.S. PATENT DOCUMENTS 4,296,392 10/1981 Lee ............................. 330/107
4,331,894  5/1982 Gregorian et al. ........ 307/352
4,331,944  5/1982 Lee ............................. 330/107
4,353,044 10/1982 Nossek ........................ 333/173
4,383,228  5/1983 Gaillard ..................... 333/173
4,484,089 11/1984 Viswanatham ............ 307/353

OTHER PUBLICATIONS

Caves, et al., "Sampled Analog Filter Using Switched Capacitor as Resistor Equivalents", IEEE Journal of Solid-State Circuits, vol. SC-12, No. 6, Dec. 1977, pp. 592-599.
Teramoto, "Active RC Transfer Network Using Frequency Dependent Impedance Converters," IECE of Japan, vol. 55, No. 10, pp. 497-503, Oct. 1972.

Primary Examiner—Stanley D. Miller
Assistant Examiner—Timothy P. Callahan
Attorney, Agent, or Firm—Finnegan, Henderson, Farabow, Garrett & Dunner

[57] ABSTRACT

Disclosed is a switched capacitor filter circuit employing the equivalent resistance of a switched capacitor circuit as the resistive element in a frequency dependent impedance converting circuit.

18 Claims, 23 Drawing Figures

FIG. 3
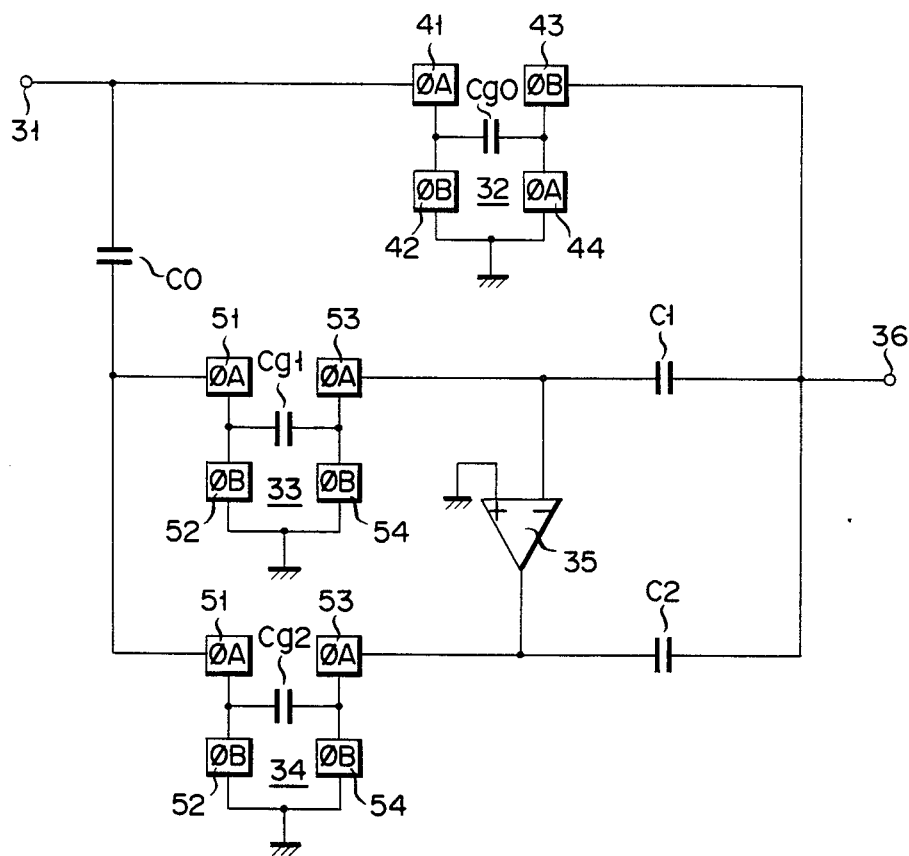
FIG. 4A ØA
FIG. 4B ØB

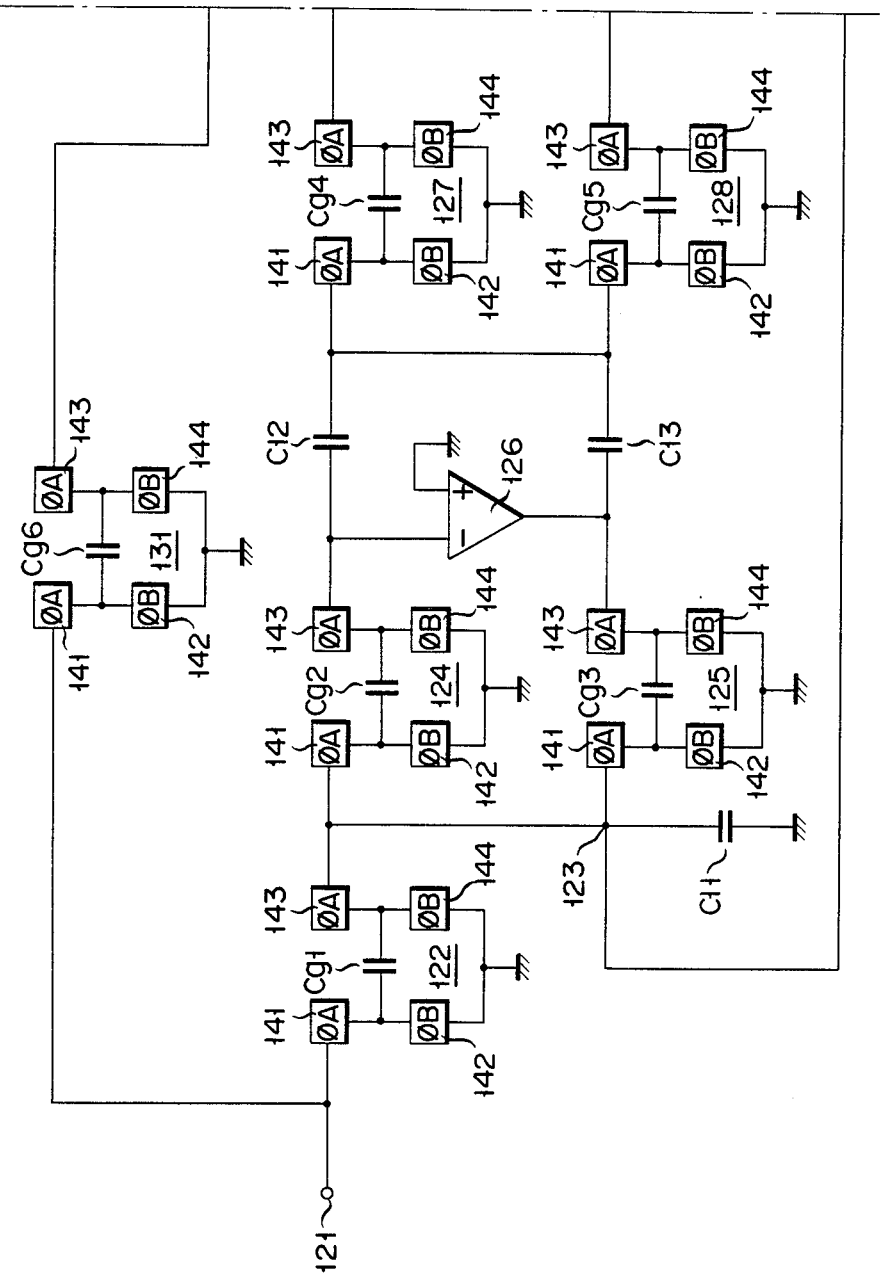
F I G. 14A

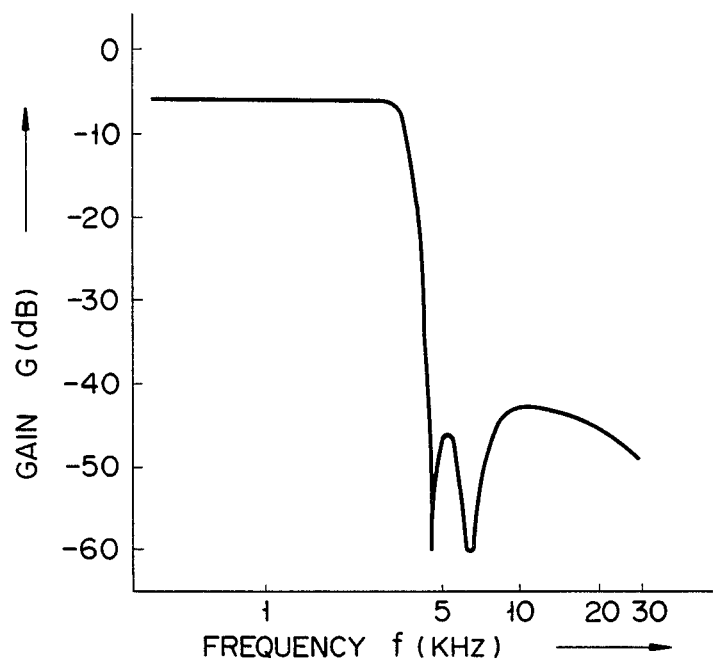
F I G. 19
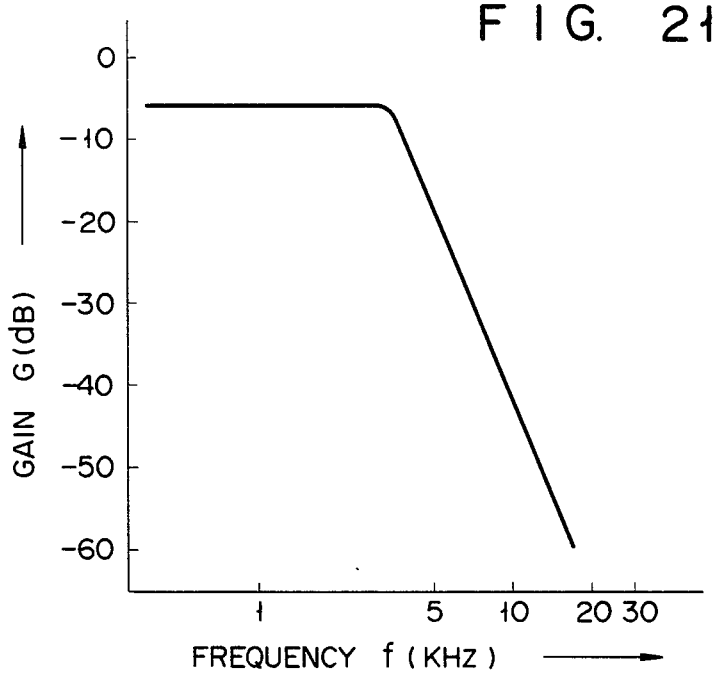
F I G. 21

SWITCHED CAPACITOR FILTER CIRCUIT

BACKGROUND OF THE INVENTION

The present invention relates to a filter circuit of the capacitor-resistor type and, more particularly, to a switched capacitor filter circuit of the m-derived type, in which an equivalent resistance of a switched capacitor citcuit is used as a resistor element.

There is currently a strong demand for small, inexpensive IC filter circuits in industrial and civil electronics technologies, such as codec (coder and decoder), speech recognition, and speech synthesizing. The so-called leap frog method of filter formation is one which has long been known in this field. The filter circuits shown in FIGS. 1 and 2, arranged on the basis of the leap frog method, employ the equivalent resistance of the switched capacitor circuit. The third-order m-derived low pass filter circuit of FIG. 1 uses three switched capacitor circuits 1, 2, 3 as resistor elements, and three integrating circuits 4, 5, 6. The fifth-order m-derived low pass filter circuit of FIG. 2 uses six switched capacitor circuits 11 to 16 as resistor elements, and five integrated circuits 17 to 21.

The filter circuits shown in FIGS. 1 and 2 each need the number of integrated circuits equal to the order of filtering. Further, each integrating circuit is composed of an operational amplifier and a capacitor. Accordingly, the third-order m-derived filter of FIG. 1 needs three integrated circuits; while the fifth-order m-derived filter circuit of FIG. 2 needs five integrated circuits. This would indicate an increase in power dissipation. In addition to operational amplifiers, the filter circuit of FIG. 1 must use 11 capacitors and 20 switch elements; while the fifth-order m-derived filter circuit of FIG. 2 employs 11 capacitors and 22 switches. Requiring a number of circuit elements is problematic when the filter circuit is moduled into the integrated circuits, since it results in increasing the chips size.

SUMMARY OF THE INVENTION

Accordingly, a primary object of the present invention is to provide a switched capacitor filter circuit which entails less power dissipation and employs an IC chip of a reduced size, when it is fabricated into the integrated circuit.

According to the invention, a switched capacitor filter circuit is provided, which comprises a signal input terminal, a first resistor circuit with a negative equivalent resistance, connected at one end to said signal input terminal, a first capacitor element connected at one end to said signal input terminal, second and third resistor circuits composed of switched capacitor circuits with positive equivalent resistances, which resistor circuits are connected at one of their ends to the other end of said first capacitor element, second and third capacitor elements connected respectively at one of their ends to the other ends of said second and third resistor circuits, and at their other ends to the other end of said first resistor circuit, an amplifier circuit connected at the input terminal to a node between said second resistor circuit and said second capacitor element, and at the output terminal to a node between said third resistor circuit and said third capacitor element, and a signal output terminal provided at a node among said first resistor circuit and second and third capacitor elements, or a node between said first resistor circuit and said third capacitor element.

According to the invention, a switched capacitor filter circuit is further provided which comprises a signal input terminal, a first resistor circuit composed of a switched capacitor circuit connected at one end to said signal input terminal, a first capacitor element connected at one end to the other end of said first resistor circuit and at the other end to a reference potential point, second and third resistor circuits composed of switched capacitor circuits connected at one of their ends to a connection point between said first resistor circuit and said first capacitor element, second and third capacitor elements connected at one of their ends to the other ends of said second and third resistor circuits and interconnected at their other ends, fourth and fifth resistor circuits composed of switched capacitor circuits connected at one of their ends to the common connection point at the other ends of said second and third capacitor elements, fourth and fifth capacitor elements connected at one of their ends to the other ends of said fourth and fifth resistor circuits and interconnected at their other ends, a sixth resistor circuit composed of a switched capacitor circuit connected between said signal input terminal and the common connection point at the other ends of said fourth and fifth capacitor elements, a seventh resistor circuit composed of a switched capacitor circuit connected between the common connection point at the other ends of said fourth and fifth capacitor elements and the reference potential point, and a first amplifier circuit connected at the input terminal to a node between said second resistor circuit and said second capacitor element, and at the output terminal to a node between said third resistor circuit and said third capacitor element, a second amplifier circuit connected at the input terminal to a node between said fourth resistor circuit and said fourth capacitor element, and at the output terminal to a node between said fifth resistor circuit and said fifth capacitor element, and a signal output terminal provided at a node among said fourth and fifth capacitor elements and said sixth and seventh resistor circuits.

According to the invention, a switched capacitor filter circuit is still further provided which comprises a signal input terminal, a first resistor circuit composed of a switched capacitor circuit connected at one end to said signal input terminal, a first capacitor element connected at one end to the other end of said first resistor circuit, and at the other end to a reference potential point, second and third resistor circuits composed of switched capacitor circuits connected at one of their ends to a connection point between said first resistor circuit and said first capacitor element, second and third capacitor elements connected at one of their ends to the other ends of said second and third resistor circuits and interconnected at their other ends, fourth and fifth resistor circuits composed of switched capacitor circuits connected at one of their ends to the common connection point at the other ends of said second and third capacitor elements, fourth and fifth capacitor elements connected at one of their ends to the other ends of said fourth and fifth resistor circuits and interconnected at their other ends, a sixth resistor circuit composed of a switched capacitor circuit connected between said signal input terminal and the common connection point at the other ends of said fourth and fifth capacitor elements, a seventh resistor circuit composed of a switched capacitor circuit connected between the common connection point at the other ends of said fourth and fifth capacitor elements and the reference potential point, eighth and ninth resistor circuits respectively connected at one of their ends to a node between said first resistor circuit and said first capacitor element, and the common connection point at the other ends of said fourth and fifth capacitor elements, being interconnected at their other ends, a first amplifier circuit connected at the input terminal to a node between said second resistor circuit and said second capacitor element, and at the output terminal to a node between said third resistor circuit and said third capacitor element, a second amplifier circuit connected at the input terminal to a node between said fourth resistor circuit and said fourth capacitor element, and at the output terminal to a node between said fifth resistor circuit and said fifth capacitor element, a third amplifier circuit connected at one end to the common connection point at the other ends of said eighth and ninth resistor circuits, a tenth resistor circuit composed of a switched capacitor circuit connected between the input and output terminals of said third amplifier circuit, and a signal output terminal provided at the output terminal of said third amplifier circuit.

BRIEF DESCRIPTION OF THE DRAWINGS

FIG. 3 is a circuit diagram of a switched capacitor filter circuit according to the present invention, as applied to a third-order m-derived type low pass filter circuit;

FIGS. 4A and 4B are timing charts of clock pulses $\phi_A$, $\phi_B$ which are used in controlling the switched capacitor filter circuit shown in FIG. 3;

FIGS. 14A and 14B show a circuit diagram of a fifth-order m-derived filter circuit to which the switched capacitor filter circuit according to the present invention is applied;

FIG. 19 graphically represents a frequency characteristic of the FIG. 14 filter circuit;

FIG. 21 graphically represents a frequency characteristic of the filter circuit of FIG. 20.

DETAILED DESCRIPTION OF THE PREFERRED EMBODIMENTS

Figure 1:
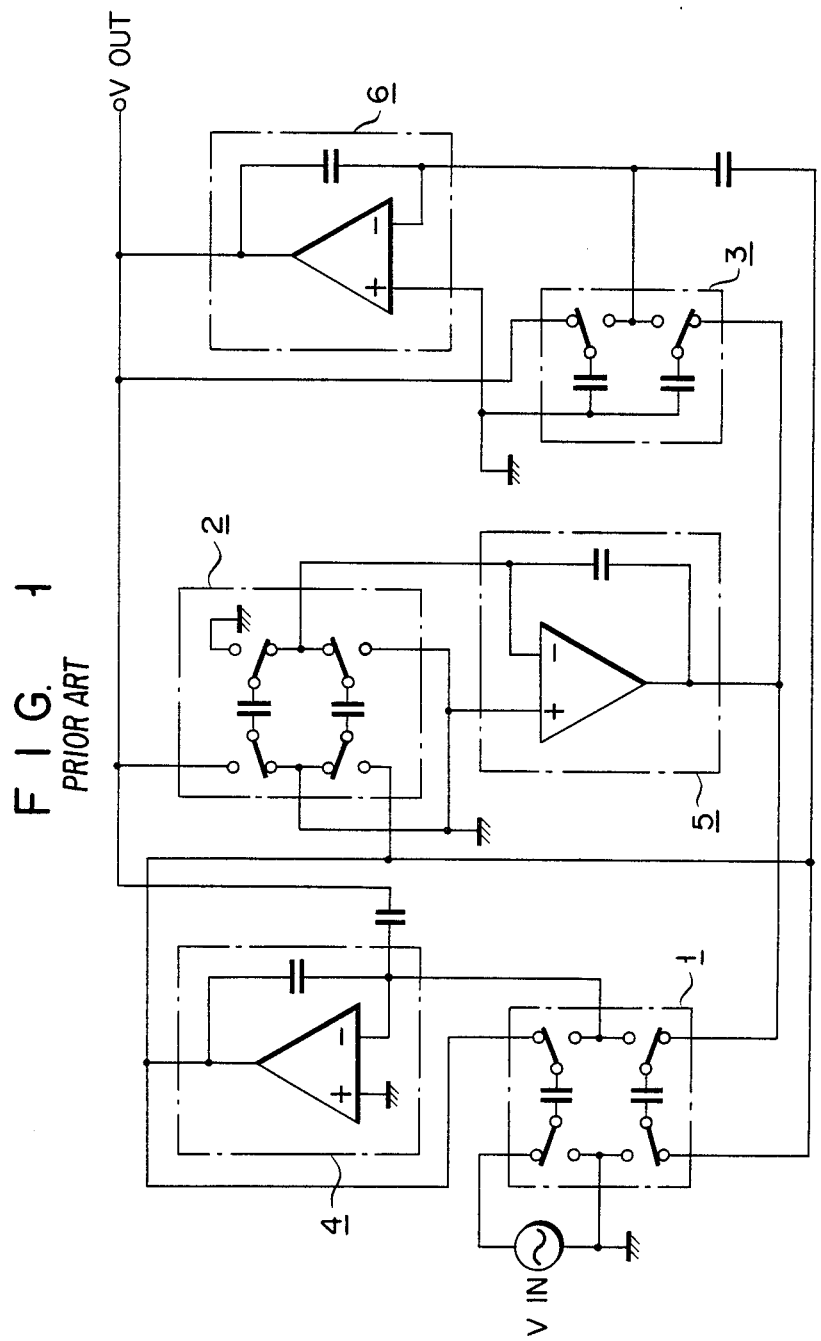
FIG. 1 is a circuit diagram of a conventional third-order m-derived low pass filter circuit of the leap frog type.

Some preferred embodiments of this invention may now be described with reference to the accompanying drawings. FIG. 3 shows the circuit arrangement of a third-order m-derived low pass filter circuit which a switched capacitor filter circuit according to the present invention is applied. As shown in the figure, a signal input terminal 31 is connected to one end of a resistor circuit 32 which serves as a switched capacitor circuit with negative equivalent resistance, and to one end of a capacitor C0. The other end of the capacitor C0 is connected to the ends of resistor circuits 33 and 34, which serve as switched capacitor circuits with positive equivalent resistance. The other ends of resistor circuits 33 and 34 are respectively connected to one of the ends of capacitors C1 and C2, the other ends of which are connected to the other end of resistor circuit 32. A node between resistor circuit 33 and capacitor C1 is connected to an inverting input terminal (−) of an amplifier circuit 35. A node between resistor circuit 34 and capacitor C2 is connected to the output terminal of the amplifier circuit 35. A noninverting input terminal (+) of the amplifier circuit 35 is grounded. A node among the resistor circuit 32 and the two capacitors C1, C2 is connected to a signal output terminal 36.

The resistor circuit 32 with negative equivalent resistance is comprised of a switch 31 connected at one end to the signal input terminal 31 and controlled by a clock pulse $\phi$; a switch 42 connected at one end to the other end of switch 31, and at the other end to a ground potential, and being controlled by a clock pulse $\phi_B$; a switch 43 connected at one end to the output terminal 36 and controlled by clock pulse $\phi_B$; a switch 44 connected at one end to the other end of switch 43, and at the other end to the ground potential, and being controlled by clock pulse $\phi_A$; and a capacitor Cg0 connected between a node between switches 41 and 42 and a node between switches 43 and 44.

Each of the resistor circuits 33, 34 with positive equivalent resistance is comprised of: a switch 51 connected at one end to the other end of the capacitor C0 and controlled by clock pulse $\phi_A$; a switch 52 connected at one end to the other end of switch 51, and at the other end to the ground potential, and being controlled by clock pulse $\phi_B$; a switch 53 for providing a signal at one end, which is controlled by clock pulse $\phi_A$; and a switch 54 connected at one end to the other end of switch 53, and at the other end to the ground potential. Resistor circuit 33 is further provided with a capacitor Cg1 connected between a node lying between switches 51 and 52, and a node lying between switches 53 and 54. Resistor circuit 34 is likewise provided with a capacitor Cg2 connected between a node lying between switches 51 and 52, and a node lying between switches 53 and 54. In this regard, switches 41 to 44 and 51 to 54 may all be made of MOS FETs (metal oxide semiconductor field effect transistors).

FIGS. 4A and 4B show timing charts of the clock pulses $\phi_A$, $\phi_B$ applied to resistor circuits 32 to 34.

In the switched capacitor circuit, the equivalent resistance R is generally given by the following equation:

$$R = (1/C \cdot fc) \tag{1}$$

where C is the capacitance of the capacitor and fc is the frequency of the clock pulses controlling the switches. The above equation (1) indicates that the resistor circuits 32 to 34 each act as a reactive element, of which the reactance is determined by the frequency of the clock pulses of $\phi_A$, $\phi_B$ and the capacitance of the capacitors Cg0, Cg1, Cg2.

The circuit of FIG. 3 serves as a third-order m-derived low pass filter circuit when the resistances of the resistor circuits 32–34 and the capacitance of the capacitors C0–C2 are appropriately selected.

Why the circuit of FIG. 3 functions a a third-order m-derived low pass filter circuit may be explained with reference to FIG. 5.

Figure 5:
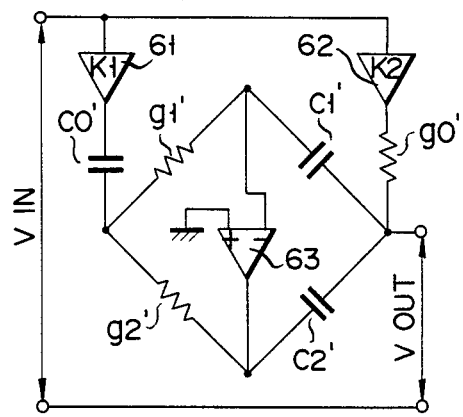
FIG. 5 is a circuit diagram of a third-order m-derived low pass filter circuit arranged on the basis of the impedance converter theory.

FIG. 5 shows a circuit arrangement of the third-order low pass filter circuit which is designed on the basis of a frequency dependent impedance conversion (FDIC) theory. In FIG. 5, coefficient multipliers 61 and 62, in conjunction with coefficients K1 and K2, respectively, are connected to one of the voltage supply terminals for the input voltage $V_{IN}$. One of the terminals of a capacitance C0' is connected to the output terminal of coefficient multiplier 61. One end of a conductance g0' is connected to the output terminal of coefficient multiplier 62. The other end of capacitance C0' is connected to one of the ends of conductances g1' and g2'. The ends of capacitances C1' and C2' are jointly connected to the other end of the conductance g0'. Conductance g1', and capacitance C1' are connected at their other ends to each other. Conductance g2' and capacitance C2' are connected at their other ends to each other. An amplifier 63 is connected at the inverting input terminal (−) to the node between conductance g1' and capacitance C1'; and, at the output terminal, to a node between conductance g2' and capacitance C2'. The noninverting input terminal (+) of the amplifier 63 is grounded. The output voltage $V_{OUT}$ in this circuit (FIG. 5) is derived from a node located among conductance g0' and the two capacitances C1', C2'.

The FIG. 5 circuit may be operated as a third-order m-derived low pass filter by appropriately selecting the circuit constants. When comparing the FIG. 5 circuit to the FIG. 3 circuit, it is seen that capacitances C0' and C2' correspond to capacitances C0 to C2, respectively. Further, conductances g0' to g2' correspond to resistor circuits 32 to 34, respectively. Therefore, in operating the FIG. 3 circuit as a third-order m-derived low pass filter, the capacitances C0', C1', C2' and the conductances g0', g1', g2' are so selected that the FIG. 5 circuit has third-order m-derived low pass filter characteristics. Next, the capacitances C0, C1, C2 and resistances of the resistor circuits 32, 33, 34 are so selected as to correspond to capacitances C0', C1' and C2', and resistances g0', g1' and g2', allowing for the coefficients of the coefficient multipliers 61, 62.

Figure 6:
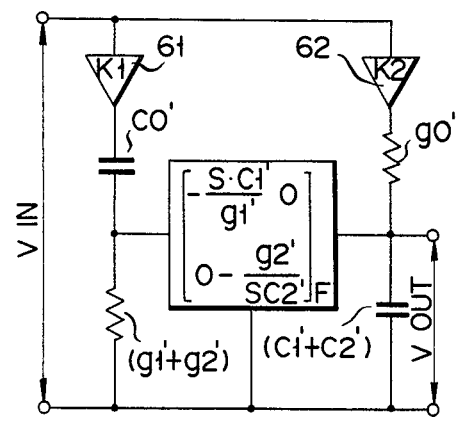
FIG. 6 is an equivalent circuit diagram of the FIG. 5 circuit when the low pass filter portion of FIG. 5 is expressed by a cascade matrix.

The explanation to follow is on how to select the circuit constants required in operating the FIG. 3 circuit as a third-order low pass filter. Reference is made to FIG. 6.

FIG. 6 is an equivalent circuit when a part of the FIG. 5 circuit is expressed by a cascade matrix F.

A transfer function G of the FIG. 5 circuit is given by the following expression.

$$G = \frac{V_{OUT}}{V_{IN}} \tag{2}$$

$$= -\frac{\frac{K1 \cdot C0' \cdot C2'}{g2'} S^2 - K2 \cdot g0'}{C0' \cdot \frac{C1' \cdot C2'}{g1' \cdot g2'} S^3 + (g1' + g2') \frac{C1' \cdot C2'}{g1' \cdot g2'} S^2 + (C1' + C2')S + g0'}$$

In the above equation, S is a complex component and $S = j\omega$, where $\omega$ is an angular frequency. A third-order m-derived low pass filter function T(S) is generally expressed is:

$$T(S) = H \cdot \frac{n^2 S^2 + 1}{(S^2 + mS + 1)(mS + 1)} \tag{3}$$

$$= H \cdot \frac{n^2 S^2 + 1}{mS^3 + (1 + m^2)S^2 + 2mS + 1}$$

In the above formula, $m^2 + n^2 = 1$, and H denotes the gain level. For obtaining the circuit constants, equation (2) is applied to equation (3) and the circuit constants are calculated under the following conditions, in simplifying the circuit arrangement: $H = -1$, $K1 = 1$, $K2 = -1$, and $$\frac{C1' \cdot C2'}{g1' \cdot g2'} = 1.$$

Then, we will obtain $$\left.\begin{array}{l} \frac{C0' \cdot C2'}{g2'} = n^2, g0' = 1 \\ C0' = m \\ g1' + g2' = 1 + m^2 \\ C1' + C2' = 2m \end{array}\right\} \tag{4}$$

Interjecting $m^2 + n^2 = 1$ into the equation (4) and rearranging it, we will obtain $$\left.\begin{array}{l} C0' = m \\ C1' = \frac{2}{3} m \\ C2' = \frac{4}{3} m \\ g0' = 1 \\ g1' = 1 + m^2 - g2' \\ g2' = \frac{C0' \cdot C2'}{1 - m^2} \end{array}\right\} \tag{5}$$

In the above equations, $C2' = 2 \times C1'$.

In the case of a low pass filter circuit in which parameter $m = 0.8$, the circuit constants in equation (5) are:

$$\left.\begin{matrix} g0' = 1 \\ g1' = 0.455 \\ g2' = 1.185 \\ C0' = 0.8 \\ C1' = 1.067 \\ C2' = 0.533 \end{matrix}\right\} \quad (6)$$

If the reference value Cx of the capacitance for a cutoff frequency $f_{co}$ of 3.3 KHz is 2 pF, the reference value gx of the conductance will be $0.4147\mu\mho$, since $gx = 2\pi f_{co} Cx$. By multiplying capacitances C0', C1' and C2' by the reference value Cx, and conductances g0', g1' and g2' by the reference value gx of the conductance, the values of the circuit elements when the cutoff frequency fco is 3.3 kHz, will be:

$$\left.\begin{matrix} g0' = 0.4147\ (\mu\mho) \\ g1' = 0.1884\ (\mu\mho) \\ g2' = 0.4914\ (\mu\mho) \\ C0' = 1.6\ (PF) \\ C1' = 2.13\ (PF) \\ C2' = 1.066\ (PF) \end{matrix}\right\} \quad (7)$$

In the above calculation, the coefficient K2 of the coefficient multiplier 62 was set at $-1$. The $-1$ of the coefficient, however, needs an inverter in an actual circuit arrangement. In this respect, the "$-1$" coefficient is problematic. In eliminating the use of the inverter, it is sufficient that conductance go' be set at a negative value, i.e., at $-0.4147\ (\mu\mho)$. The reciprocals of conductances g0', g1' and g2', i.e., resistances R0', R1' and R2', will thus be:

$$R0' = \frac{1}{g0'} = -24.11\ (M\Omega)$$

$$R1' = \frac{1}{g1'} = 53.0\ (M\Omega)$$

$$R2' = \frac{1}{g2'} = 20.35\ (M\Omega)$$

Through the above calculation, it may be seen that, in operating the FIG. 3 circuit as a third-order m-derived low pass filter circuit at 3.3 kHz of the cutoff frequency, capacitances C0, C1 and C2 must respectively be 1.6 pF, 2.13 pF and 1.066 pF, and the equivalent resistances of resistor circuits 32, 33 and 34, must be $-24.11\ M\Omega$, 53.0 $M\Omega$ and 20.35 $M\Omega$ respectively. If the clock pulses $\phi_A$, $\phi_B$ each have a frequency of 128 kHz, the equation (1) provides capacitances 0.324 pF, 0.147 pF and 0.384 pF, respectively, as the capacitances 32, 33, 34 of resistor circuits 32, 33 and 34.

Figure 7:
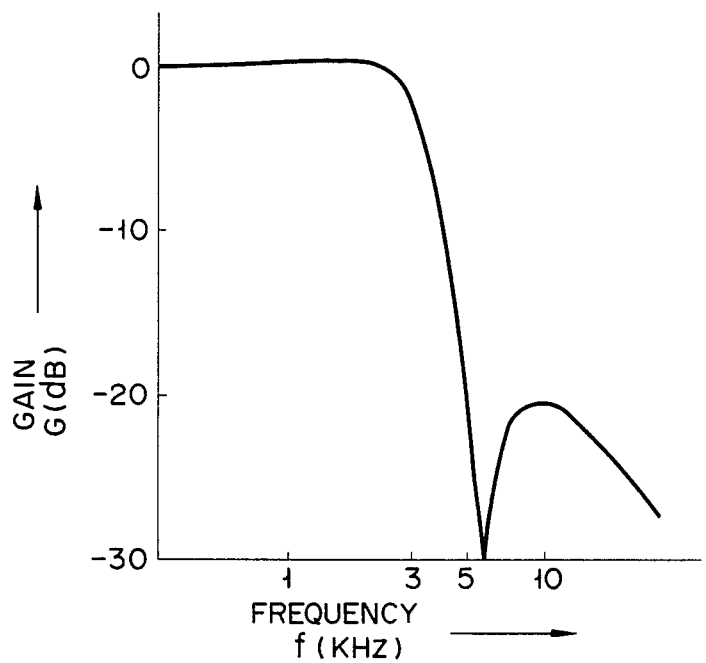
FIG. 7 is a graphical representation of a frequency characteristic of the switched capacitor filter circuit of FIG. 3.

FIG. 7 shows a curve illustrating a frequency characteristic of the FIG. 3 circuit when the circuit constants are set to the calculated ones. In the graph, the abscissa represents a frequency f and the ordinate represents a gain G (dB). As may be seen from the curve, good frequency characteristics are obtained. The curve also indicates that the FIG. 3 circuit operates as the third-order m-derived low pass filter circuit, when the circuit constants of the circuit are set to those calculated. It should be noted here that while the FIG. 1 circuit as the prior art needs three operational amplifiers, the FIG. 3 circuit needs only one operational circuit for the amplifier 15. In the FIGS. 1 and 3 circuits, most of the power is consumed by the operational amplifier or amplifiers. Therefore, in designing the third-order m-derived low pass filter circuit, the fact that only one operational amplifier is required for the filter is of very great significance from the power saving viewpoint.

Also to be noted here is that the number of circuit elements is considerably reduced. For example, the number of capacitors is reduced from 11 to 6; the number of the switches, from 20 to 12; and the number of operational amplifiers, from 3 to 1, as mentioned above. The reduction of the number of circuit elements indicates that, when the circuit is IC-moduled, the required chip size may be small. It should also be noted here that the values of the capacitors Cg0, Cg1 and Cg2, which are 0.324 pF, 0.147 pF and 0.384 pF for 3.3 kHz of the cutoff frequency, can easily be realized by using the IC technique at the present stage.

Figure 8:
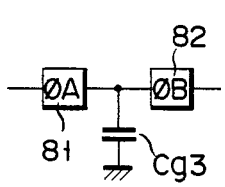
FIGS. 8 through 10 are other circuit diagrams of a resistor circuit with positive equivalent resistance, which is assembled into the filter circuit of FIG. 3.
Figure 9:
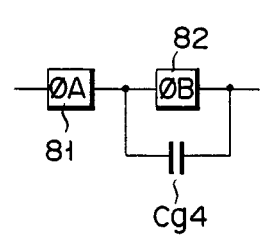
Figure 10:
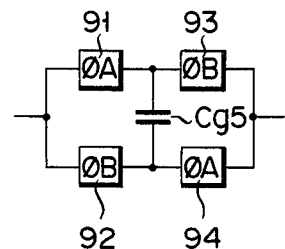

FIGS. 8 to 10 show other arrangements of the resistor circuit formed by using the switched capacitor circuits, which is replaceable by the resistor circuit 33 or 34 having positive equivalent resistance.

The resistor circuit shown in FIG. 8 is a switched capacitor circuit with positive equivalent resistance, having the simplest construction. In the arrangement, a switch 81 is supplied at one end with a signal, and controlled by the clock pulse $\phi_A$. A switch 82 is connected at one end to the other end of the switch 81, and controlled by the clock pulse $\phi_B$. A signal is derived from the other end of the switch 82. A capacitor Cg3 is connected between a node lying between the switches 81, 82 and the ground potential.

The resistor circuit of FIG. 8 uses a capacitor Cg4 connected across the switch 82, in place of the capacitor Cg3 shown in FIG. 8.

In the resistor circuit of FIG. 10, switches 91 and 92 are respectively controlled by clock pulses $\phi_A$ and $\phi_B$, and are supplied at one of the ends with a signal. Switches 93 and 94 are respectively connected at one of their ends to the other ends of switches 91 and 92 and are respectively controlled by clock pulses $\phi_A$ and $\phi_B$. The other ends of the switches 93 and 94 are interconnected. From the connection point, a signal is derived. A capacitor Cg5 is connected between the nodes lying between switches 91 and 93 and switches 92 and 94.

The resistor circuits of FIGS. 8 to 10 all have positive equivalent resistance. Particularly in the FIG. 10 circuit, for the same resistance, the capacitance of the capacitor Cg5 may be the half of that of each of the capacitors Cg3 and Cg4.

Figure 11:
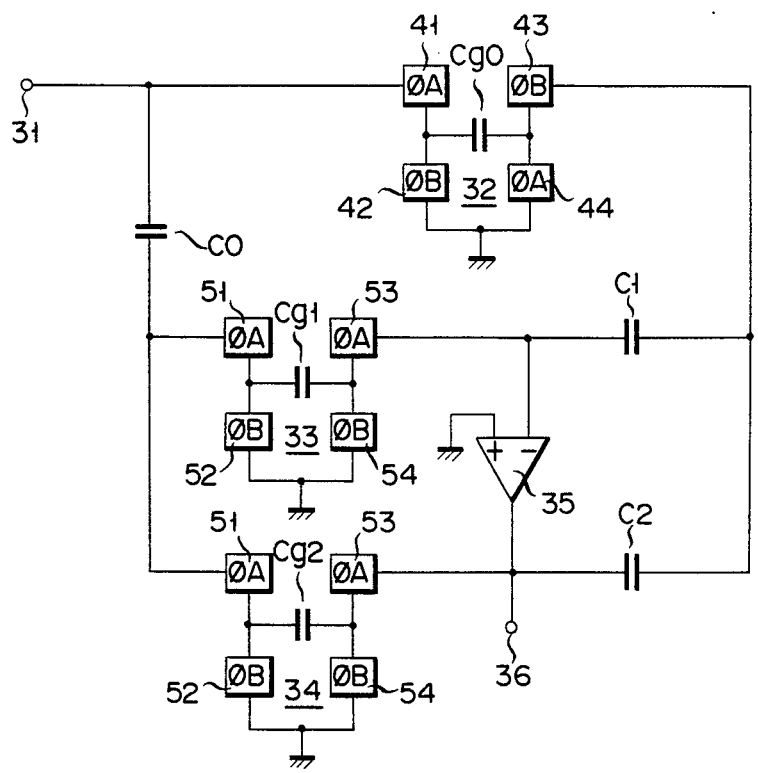
FIG. 11 is a circuit diagram of a modification of the filter circuit of FIG. 3.
Figure 12:
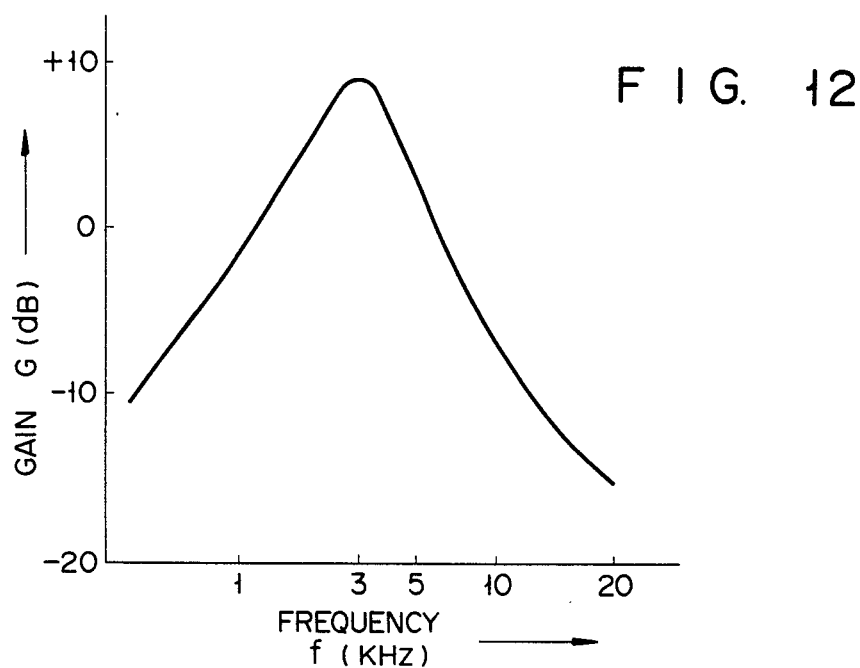
FIG. 12 is a graphical representation of the filter circuit of FIG. 11.

The above-mentioned embodiment is so designed that the signal output terminal 36 is connected to the node lying among the resistor circuit 32 and the two capacitors C1, C2. With such an arrangement, the embodiment has the third-order m-derived low pass filter characteristic shown in FIG. 7. Alternatively, the signal output terminal 36, as shown in FIG. 11, may be connected to a node lying between the resistor circuit 34 and the capacitor C2, to thereby have the band-pass characteristic shown in FIG. 12.

Figure 13:
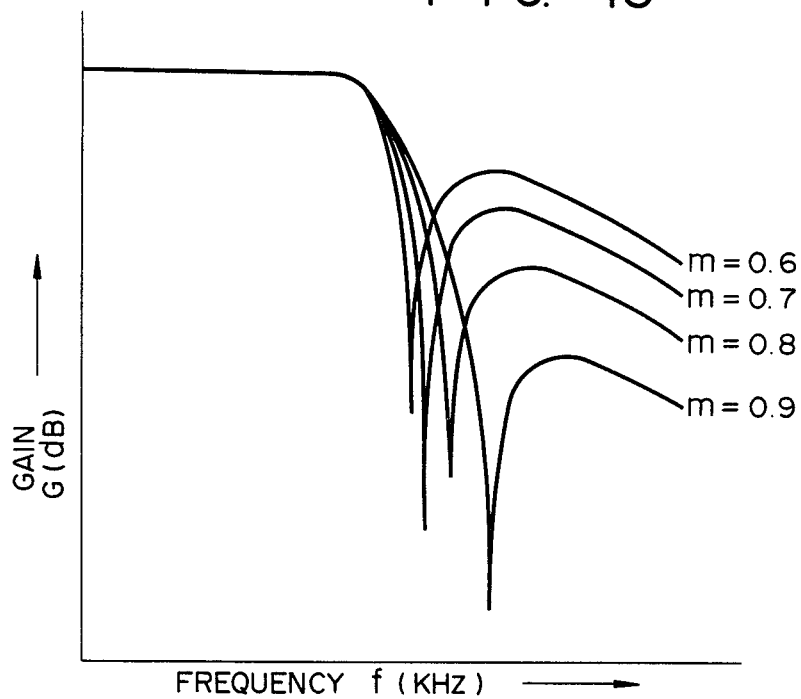
FIG. 13 is a graphical representation of frequency characteristics of the filter circuit of FIG. 3, with various values of the parameter m.

The characteristic shown in FIG. 7 is plotted with a parameter m of 0.8. For different parameters m, the third-order m-derived low filter characteristic of the filter circuit changes in such a way as to have corresponding different curves, as shown in FIG. 13.

Figure 14B:
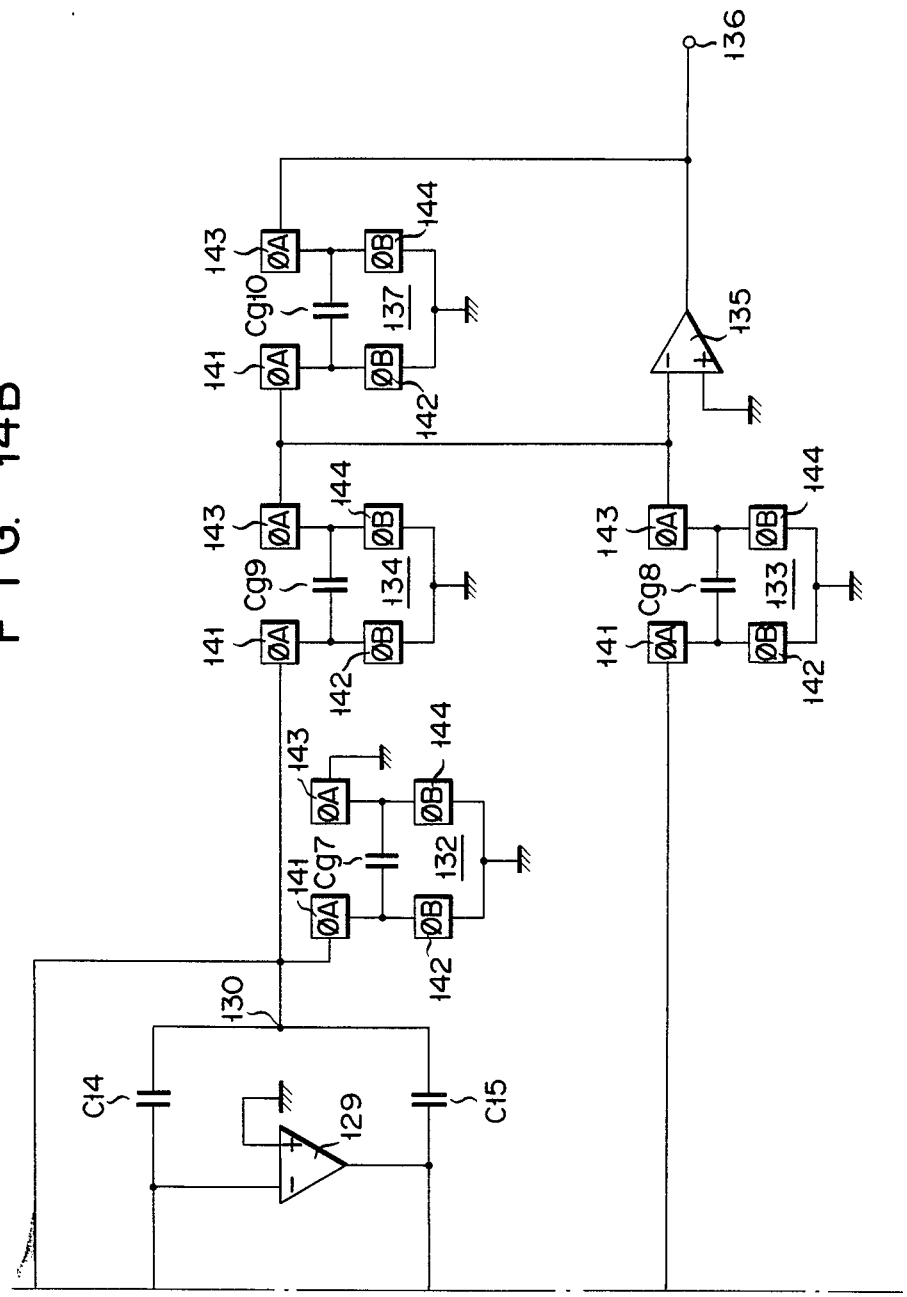

FIGS. 14A and 14B show a fifth-order m-derived low pass filter circuit into which a switched capacitor filter circuit according to the present invention is incorporated. In FIG. 14A, a signal input terminal 121 is connected to one end of a resistor circuit 122 made up of a switched capacitor circuit with positive equivalent resistance. The other end of the resistor circuit 122 is connected to one end of the capacitor C11 of which the other end is connected to the ground potential point. A node 123 between the resistor circuit 122 and the capacitor C11 is connected to the ends of two resistor circuits 124, 125, each of which is composed of a switched capacitor circuit with positive equivalent resistance. The other ends of the resistor circuits 124, 125 are connected to the ends of two capacitors C12 and C13 which are interconnected at the other ends. A node between the resistor circuit 124 and the capacitor C12 is connected to the inverting input terminal (−) of an amplifier circuit 126. The output terminal of the amplifier circuit 126 is connected to a node between the resistor circuit 125 and the capacitor C13. The noninverting input terminal (+) of the amplifier circuit 126 is grounded. The common connection point of the capacitors C12, C13 is connected to one of the ends of resistor circuits 127 and 128, each of which is comprised of a switched capacitor circuit with positive equivalent resistance. The other ends of resistor circuits 127 and 128 are connected to the ends of capacitors C14 and C15, respectively. The other ends of the capacitors are connected together. The inverting input terminal (−) of an amplifier circuit 129 is connected to a node between the resistor circuit 127 and the capacitor C14. The output terminal of the amplifier circuit 129 is connected to a node between the resistor circuit 128 and the capacitor C15. The noninverting input terminal (+) of the amplifier circuit 129 is grounded. A resistor circuit 131 composed of a switched capacitor circuit with positive equivalent resistance is connected between the signal input terminal 121 and a common connection point 130 of the other ends of the capacitors C14 and C15. A resistor circuit 132 composed of a switched capacitor circuit with positive equivalent resistance is connected between the connection point 130 and the ground potential point. Nodes 123 and 130 are respectively connected to one of the ends of resistor circuits 133 and 134, each of which circuits is composed of a switched capacitor circuit with positive resistance, the other ends of which circuits are jointly connected to the inverting input terminal (−) of an amplifier circuit 135. The amplifier circuit 135 is grounded at the noninverting input terminal (+). The output terminal of the amplifier circuit 135 is connected to a signal output terminal 136. Connected between the inverting input terminal (−) of the amplifier circuit 135 and the output terminal is a resistor circuit 137 made up of a switched capacitor circuit with positive equivalent resistance.

Each of the resistor circuits with a positive equivalent resistance 122, 124, 125, 127, 128, 131, 132, 133, 134, 137 has the same construction as the resistor circuits with a positive equivalent resistance 33, 34 in the FIG. 3 filter circuit. The other end of a switch 141, which is supplied at one end with a signal and controlled by clock pulse $\phi_A$ (FIG. 4A), is connected to one end of a switch 142 made of an MOSFET and controlled by clock pulse $\phi_B$ (FIG. 4B). The other end of switch 142 is connected to the ground potential point. The other end of switch 143, which produces a signal at one end and is under the control of clock pulse $\phi_A$, is connected to one end of a switch 144 controlled by clock pulse $\phi_B$. In the resistor circuit 122, a capacitor Cg11 is inserted between the nodes lying between switches 141 and 142 and between switches 143 and 144. This connection is correspondingly applied to the capacitors Cg12 to Cg20 in resistor circuits 124 to 128, 131 to 134, and 137. The switches 141 to 144 in the resistor circuits may be made up of MOSFET.

The circuit of FIGS. 14A and 14B may be operated as a fifth-order m-derived low pass filter circuit by appropriately setting the values of the resistor circuits and the capacitors C11 to C15, as in the case of the FIG. 3 filter circuit.

Why the circuit of FIGS. 14A and 14B functions as a fifth-order m-derived low pass filter circuit may be explained with reference to FIGS. 15 to 18.

Figure 15:
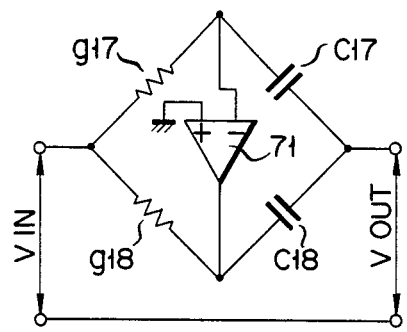
FIG. 15 is a circuit diagram of a low pass filter arranged on the basis of the impedance conversion theory.

FIG. 15 shows a basic arrangement of the low pass filter arranged on the basis of the FDIC theory. In the figure, two conductances g17 and g18 are connected at ends to one of the supply terminals for an input voltage $V_{IN}$. The other end of the conductance g17 is connected to one end of a capacitor C17. One end of capacitor C18 is connected to the other end of conductance G18. An amplifier circuit 171 is connected at the inverting input terminal (−) to a node lying between conductance G17 and capacitor C17, and at the output terminal to a node lying between conductance g18 and capacitor C18. The amplifier circuit 171 is grounded at the noninverting input terminal (+). The output voltage $V_{OUT}$ in the circuit is derived from a common connection point between capacitors C17 and C18.

Figure 16:
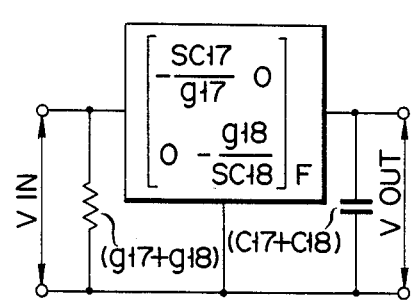
FIG. 16 is an equivalent circuit of the FIG. 15 circuit when the filter section of the FIG. 15 circuit is expressed by a cascade matrix F.

FIG. 16 shows an equivalent circuit of the basic circuit of FIG. 15 when it is defined by the cascade matrix F. It is known that a high order filter circuit may be formed by connecting the basic circuits of FIG. 15 in a cascade fasion.

Figure 17:
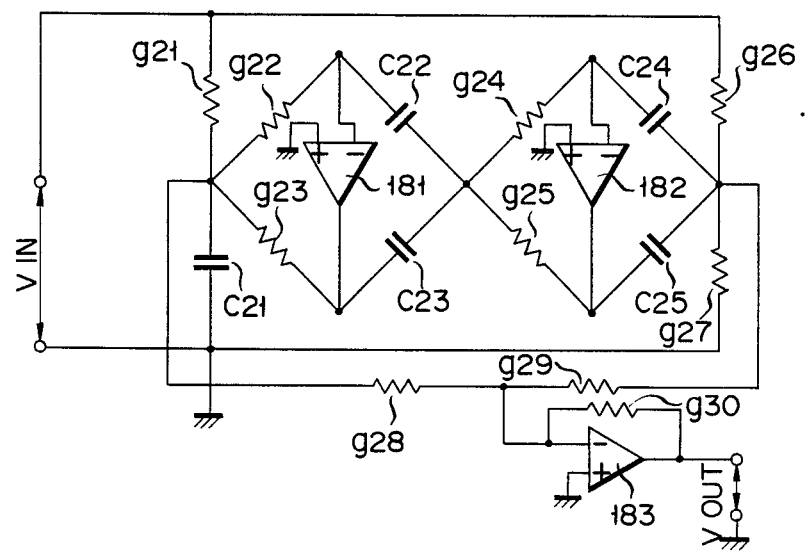
FIG. 17 is a fifth-order m-derived type low pass filter composed of two stages of the FIG. 15 circuits, in a cascade fashion.

FIG. 17 illustrates an arrangement of a fifth-order m-derived low pass filter circuit employing the two FIG. 15 basic circuits connected in a cascade fashion. In the figure, a first stage basic circuit is comprised of conductances g22 and g23 corresponding to those g17 and g18 in the FIG. 15 circuit, capacitors C22 and C23 corresponding to those C17 and C18 in FIG. 15, and an amplifier circuit 181 corresponding to that 71 in FIG. 15. A second stage basic circuit is comprised of conductances g24, g25 corresponding to those such as conductances g17 and g18; capacitors C17, C18 corresponding to those such as capacitors C17 and C18, and an amplifier circuit 182 corresponding to one such as amplifier circuit 71. An input terminal of the first stage circuit, i.e., a node between conductances g22 and g23, is connected, through conductance g21, to one of the input terminals for input voltage $V_{IN}$ application; and, through capacitor C21, to the other input terminal. An output terminal of the second stage basic circuit 182, i.e., a node between capacitors C24 and C25, is connected to one of the input terminals; and, through conductance g27, to the other input terminal. The input terminal of the first stage circuit 181 and the output terminal of the second stage basic circuit 182 are interconnected through conductances g28 and g29. A node between conductances g28 and g29 is connected to the inverting input terminal (−) of an amplifier circuit 183. The noninverting input terminal (+) of the amplifier circuit 183 is grounded. The output terminal of the amplifier circuit 183 serves as an output terminal of the cascade circuit, from which the output voltage $V_{OUT}$ is derived. A conductance for feedback is connected between the output terminal of the amplifier circuit 183 and the noninverting input terminal (+). The transfer function G of this cascade circuit is given by the following equation:

$$\frac{V_{OUT}}{V_{IN}} = \tag{8}$$

$$\frac{-\frac{g21g28}{g30C21}\left[S^4 + \left(\frac{g22g24g29}{C22C24g28} + \frac{g23g25g26}{C23C25g21}\right)S^2 + \frac{g22g23g24g25g26g29}{C22C23C24C25g21g28}\right]}{\left[S^5 + \frac{g21+g28+g22+g23}{C21}S^4 + \frac{(C22+C23)g22g23}{C21C22C23}S^3 + \frac{(g24+g25)g22g23}{C21C22C23}S^2 + \frac{(C24+C25)g22g23g24g25}{C21C22C23C24C25}S + \frac{(g26+g29+g27)g22g23g24g25}{C21C22C23C24C25}\right]}$$

where S is a complex component, S=jx, and w is an angular frequency. When comparing the FIG. 17 circuit to the circuit of FIGS. 14A and 14B, it is seen that the conductances g21 to g30 correspond to resistor circuits 122, 124, 125, 127, 128, 131 to 134, and 137; and the capacitors C21 to C25 correspond to capacitors C11 to C15, respectively. Therefore, the values of the capacitors and the conductances in the FIG. 17 circuit are first selected in such a way as to have a characteristic of the third-order m-derived low pass filter circuit. Then, the values of the resistor circuits and the capacitors in the circuit of FIGS. 14A and 14B are so selected as to satisfy the corresponding values in the FIG. 17 circuit.

An explanation may now be given as to how to select the circuit constants in the circuit of FIGS. 14A and 14B, in operating a circuit such as the fifth-order m-derived low pass filter circuit. For this purpose, reference is made to FIG. 18.

Figure 18:
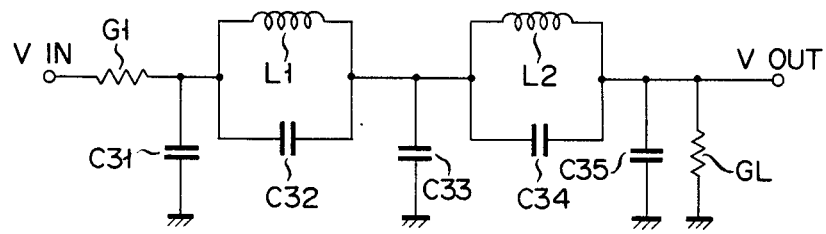
FIG. 18 is a circuit diagram of a fifth-order m-derived type low pass filter circuit of the LCR ladder type.

FIG. 18 shows a usual LCR ladder type fifth-order m-derived low pass filter circuit, such as that composed of conductances G1 and $G_L$, capacitors C31 to C35, and inductances L1 and L2. More specifically, an input terminal of a first parallel circuit composed of an inductance L1 and a capacitor C32 is coupled to an input voltage $V_{IN}$, via a conductance G1. The output terminal of the first parallel circuit is connected to the input terminal of a second parallel circuit composed of an inductance L2 and a capacitor C34. An output voltage $V_{OUT}$ of the filter circuit is derived from the output terminal of the second parallel circuit. A capacitance C31 is connected between the input terminal of the first parallel circuit and ground. Another capacitance C33 is connected between the output terminal of the first parallel circuit and ground. A capacitor C35 and an inductance $G_L$ are connected between the output terminal of the second parallel circuit and ground. The transfer function of this filter is given $$\frac{V_{OUT}}{V_{IN}} = \tag{9}$$

$$\frac{G1 \cdot [C32C34L1L2 \cdot S^4 + (C32L1+C34L2)S^2 + 1]}{[(C31C33C35+C31C32C35+C32C33C35+C31C33C34} $$

$$+C31C32C34+C32C33C34+C31C34C35+C32C34C35)L1L2S^5$$

$$+\{(C33C35+C32C35+C33C34+C32C34+C34C35)G1+(C32C34$$

$$+C31C33+C31C32+C32C33+C31C34)G_L\}L1L2S^4+\{(C31C33$$

$$+C31C32+C32C33+C31C35+C32C35)L1+(C31C35+C33C35$$

$$+C31C34+C33C34+C34C35)L2+(C32+C33+C34)G1G_LL1L2\}S^3$$

$$+\{(C35L2+C33L1+C32L1+C34L2+C35L1)G1+(C32L1+C34L2$$

$$+C31L2+C33L2+C31L1)G_L\}S^2+(C31+C33+C35+G1G_LL2$$

$$+G1G_LL1)S+G1+G_L]$$

In designing a Codec transmission filter, using the filter circuit of FIG. 18, for example, which circuit has the above transfer function, the circuit $$\left.\begin{array}{l} G1 = G_L = 1 \\ C31 = 0.35321179 \times 10^{-4} \\ C32 = 0.29482572 \times 10^{-4} \\ C33 = 0.75321297 \times 10^{-4} \\ C34 = 0.96843687 \times 10^{-5} \\ C35 = 0.48346315 \times 10^{-4} \\ L1 = 0.40151484 \times 10^{-4} \\ L2 = 0.56941581 \times 10^{-4} \end{array}\right\} \tag{10}$$

Interjecting the circuit constants into the equation (9), we obtain $$\frac{V_{OUT}}{V_{IN}} = 763.37044 \cdot \frac{S^4 + 2.6581828 \times 10^9 S^2}{S^5 + 3.5024576 \times 10^4 S^4} \tag{11}$$

$$\frac{+ 1.5319066 \times 10^{18}}{+ 1.19000176 \times 10^9 S^3 + 2.2110229 \times 10^{13} S^2}$$

$$\overline{+ 2.9946523 \times 10^{17} S + 2.3388245 \times 10^{21}}$$

By applying equation (11) to the equation (8), and by calculating the conductances under conditions which apply to equation (12), we obtain the values shown in equation (13).

$$\left.\begin{array}{l} C21 = 10 \text{ (PF)} \\ C22 = 2.224491 \text{ (PF)} \\ C23 = 22.382127 \text{ (PF)} \\ C24 = C25 = 6.4021385 \text{ (PF)} \end{array}\right\} \tag{12}$$

$$\left.\begin{array}{l} g21 = 32.22272^{-1} \, (\mu\mho) \\ g26 = 16.881231^{-1} \, (\mu\mho) \\ g29 = 32.865127^{-1} \, (\mu\mho) \\ g28 = 112.77795^{-1} \, (\mu\mho) \\ g30 = 27.740592^{-1} \, (\mu\mho) \\ g27 = 96.742908^{-1} \, (\mu \quad) \\ g22 = g23 = 6.4444545^{-1} \, (\mu\mho) \\ g24 = 20.618061^{-1} \, (\mu\mho) \\ g25 = 2.446844^{-1} \, (\mu\mho) \end{array}\right\} \tag{13}$$

As may be seen, the filter circuit of FIGS. 14A and 14B operates as a fifth-order m-derived type low pass filter circuit when the capacitances C21 to C25 given by equation (12) are applied to capacitors C11 and C15 and the conductances of resistor circuits 122, 124, 125, 128, 131, 133, 134 and 137 are set at the values in equation (13).

If the frequency of the clock pulses $\phi_A$, $\phi_B$ controlling the switches in the resistor circuits in the circuit FIGS. 14A and 14B is set at 128 kHz, the capacitors can be calculated by using the relationship (1) expressed as follows.

| | |
|---|---|
| $Cg1 = 0.242$ PF, | $Cg2 = 1.212$ PF |
| $Cg3 = 1.212$ PF, | $Cg4 = 0.379$ PF |
| $Cg5 = 3.19$ PF, | $Cg6 = 0.463$ PF |
| $Cg7 = 0.0807$ PF, | $Cg8 = 0.069$ PF |
| $Cg9 = 0.238$ PF, | $Cg10 = 0.282$ PF |

FIG. 19 shows a curve illustrating a frequency response of the circuit of FIGS. 14A and 14B whereby the circuit cnstants are set at the above values. In the graph, the abscissa represents frequency f (kHz) and the ordinate represents gain G dB. As may be seen from FIG. 19, the circuit of FIGS. 14A and 14B has a good frequency response, and this curve indicates that the circuit of FIGS. 14A and 14B is a fifth-order m-derived low pass filter circuit.

Figure 2:
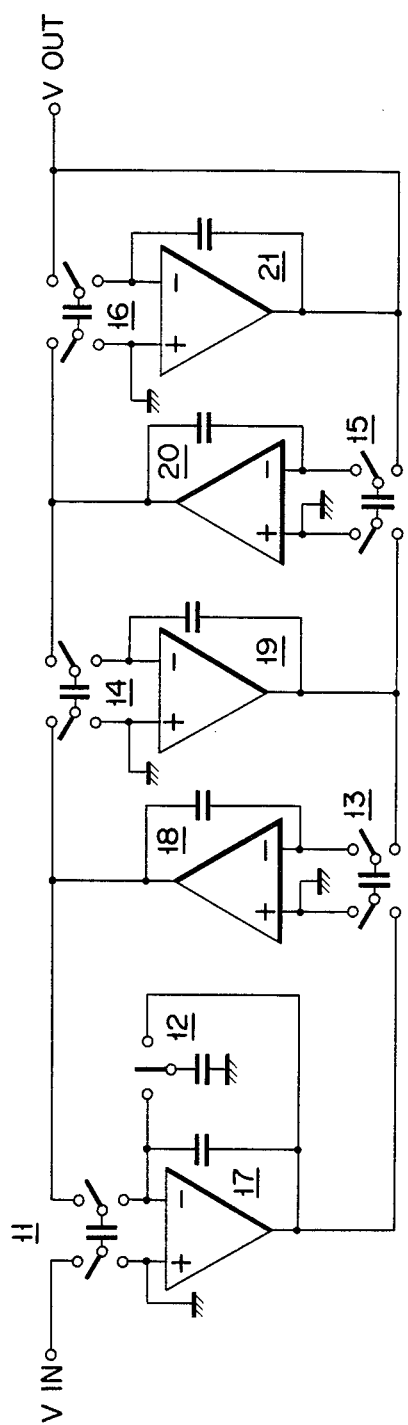
FIG. 2 is a circuit diagram of a conventional fifth-order m-derived low pass filter circuit of the leap frog type.

When comparing the circuit of FIGS. 14A and 14B to the prior art circuit of FIG. 2, it is may be seen that, while the prior art circuit needs five operational amplifiers, the circuit of FIGS. 14A and 14B needs only three, for three amplifier circuits 126, 129, 135. In the circuits of FIGS. 2, 11 and 14A and 14B, most of the power is consumed by the operational amplifiers. Therefore, the circuit of FIGS. 14A and 14B, saving two operational amplifier, constributes greatly to power consumption.

Further, in modulating the circuits into the integrated circuit, the chip size will depend largely on the number of operational amplifiers contained therein. In this respect, the circuit of FIGS. 14A and 14B greatly reduces the chip size. Further, the values of capacitors C11–C15 and Cg1 to Cg10 can easily be realized by means of present IC technology.

Figure 20:
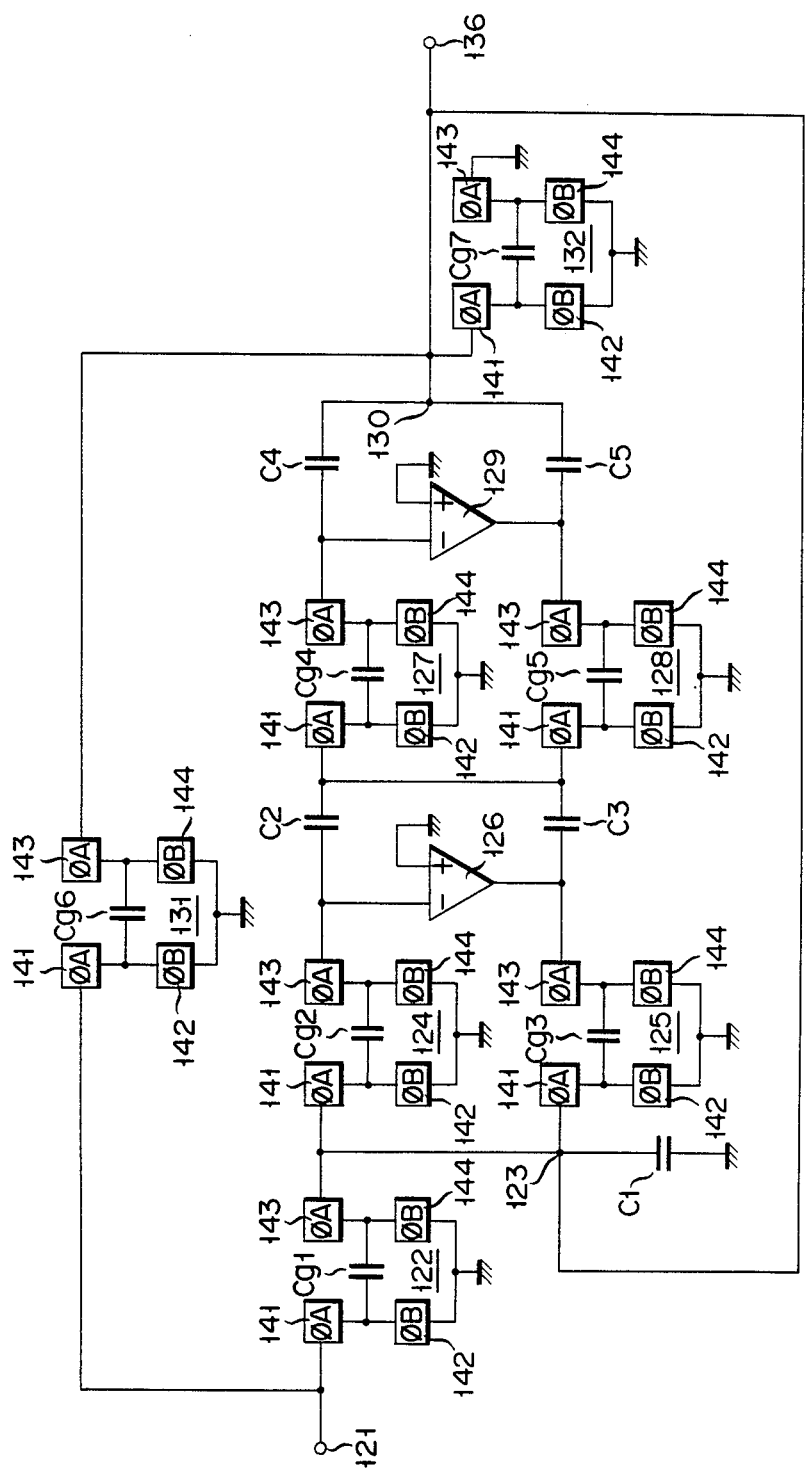
FIG. 20 is a circuit diagram of a modification of the filter circuit shown in FIG. 14.

The circuit of FIGS. 14A and 14B is operable as a fifth-order m-drived low pass filter circuit when it is modifed into the circuit shown in FIG. 20, in which circuit the three resistor circuits 133, 134, 137, and the amplifier circuit 135 are omitted, the output terminal being connected to the node 130. The frequency response of this modification is shown in FIG. 21. The resistor circuits of FIGS. 14A, 14B and 20 are replaceable by those of FIGS. 8, 9 and 10.

As may be seen from the foregoing description, the switched capacitor circuits are used for the resistor elements in the frequency dependent impedance converting circuit (FDIC). Therefore, a switched capacitor filter circuit has been proposed which entails less power dissipation and permits the use of a smaller chip when it is modulated into the IC.

What is claimed is:

1. A switched capacitor filter circuit comprising:
a signal input terminal;
a first resistor circuit composed of a switched capacitor circuit with a negative equivalent resistance, connected at one end to said signal input terminal;
a first capacitor element connected at one end to said signal input terminal;
second and third resistor circuits composed of switched capacitor circuits with positive equivalent resistances, which resistor circuits are connected at one of their ends to the other end of said first capacitor element;
second and third capacitor elements connected respectively at one of their ends to the other ends of said second and third resistor circuits, and at their other ends to the other end of said first resistor circuit;
an amplifier circuit connected at the input terminal to a node between said second resistor circuit and said second capacitor element, and at the output terminal to a node between said third resistor circuit and said third capacitor element; and
a signal output terminal provided at a node between said first resistor circuit and second and third capacitor elements, or a node between said third resistor circuit and said third capacitor element.

2. A switched capacitor filter circuit according to claim 1, in which said first resistor circuit with negative equivalent resistance includes a first switch element supplied at one end with a signal and controlled by a first clock pulse; a second switch element connected at one end to the other end of said first switch element and at the other end to a reference potential point, and being controlled by a second clock pulse; a third switch element producing a signal at one end and being controlled by said second clock pulse; a fourth switch element connected at one end to the other end of said first switch element and at the other end to the reference potential point, and being controlled by said first clock pulse; and a capacitor element connected to a node between said first and second switch elements, and a node between said third and fourth switch elements.

3. A switched capacitor filter circuit according to claim 1, in which either of said second and third resistor circuits includes fifth and sixth switch elements supplied at one of their ends with a signal and controlled by said first and second clock pulses, respectively; seventh and eighth switch elements connected at one of their ends to the other ends of said fifth and sixth switch elements, and interconnected at their other ends, being controlled by said second and first clock pulses, respectively, and a signal being derived from the connection point of the other ends of said seventh and eighth switch elements; and a capacitor element connected to a node between said fifth and seventh switch elements and a node between said sixth and eighth switch elements.

4. A switched capacitor filter circuit according to claim 1, in which either of said second and third resistor circuits with positive equivalent resistance includes a ninth switch element supplied at one end with a signal and controlled by said first clock pulse; a tenth switch element connected at one end to the other end of said ninth switch element and controlled by said second clock pulse, a signal being derived from the other end of said tenth switch element; and a capacitor element connected between a node of said ninth and tenth switch elements and the reference potential point.

5. A switched capacitor filter circuit according to claim 1, in which either of said second and third resistor circuits with positive equivalent resistance includes an eleventh switch element supplied at one end with a signal and controlled by said first clock pulse; a twelfth switch element connected at one end to the other end of said eleventh switch element and being controlled by said second clock pulse, a signal being derived from the other end of said twelfth switch element; and a capacitor element connected between the input and output terminals of said twelfth switch element.

6. A switched capacitor filter circuit according to claim 1, in which either of said second and third resistor circuits with positive equivalent resistance includes a thirteenth switch element supplied at one end with a signal and controlled by said first clock pulse; a fourteenth switch element connected at one end to the other end of said thirteenth switch element and at the other end to the reference potential point, and being controlled by said second clock pulse; a fifteenth switch element controlled by said first clock pulse, a signal being derived from one end of said fifteenth switch element; a sixteenth switch element connected at one end to the other end of said fifteenth switch element and at the other end to the reference potential point, and being controlled by said second clock pulse; and a capacitor element connected between a connection point between said thirteenth and fourteenth switch elements and a node between said fifteenth and sixteenth switch elements.

7. A switched capacitor filter circuit comprising:
a signal input terminal;
a first resistor circuit composed of a switched capacitor circuit connected at one end to said signal input terminal;
a first capacitor element connected at one end to the other end of said first resistor circuit and at the other end to a reference potential point;
second and third resistor circuits composed of switched capacitor circuits connected at one of their ends to a connection point between said first resistor circuit and said first capacitor element;
second and third capacitor elements connected at one of their ends to the other ends of said second and third resistor circuits and interconnected at their other ends;
fourth and fifth resistor circuits composed of switched capacitor circuits connected at one of their ends to the common connection point at the other ends of said second and third capacitor elements;
fourth and fifth capacitor elements connected at one of their ends to the other ends of said fourth and fifth resistor circuits and interconnected at their other ends;
a sixth resistor circuit composed of a switched capacitor circuit connected between said signal input terminal and the common connection point at the other ends of said fourth and fifth capacitor elements;
a seventh resistor circuit composed of a switched capacitor circuit connected between the common connection point at the other ends of said fourth and fifth capacitor elements and the reference potential point, and a first amplifier circuit connected at the input terminal to a node between said second resistor circuit and said second capacitor element, and at the output terminal to a node between said third resistor circuit and said third capacitor element;
a second amplifier circuit connected at the input terminal to a node between said fourth resistor circuit and said fourth capacitor element, and at the output terminal to a node between said fifth resistor circuit and said fifth capacitor element; and a signal output terminal provided at a node between said fourth and fifth capacitor elements and said sixth and seventh resistor circuits.

8. A switched capacitor filter circuit comprising:
a signal input terminal;
a first resistor circuit composed of a switched capacitor circuit connected at one end to said signal input terminal;
a first capacitor element connected at one end to the other end of said first resistor circuit, and at the other end to a reference potential point;
second and third resistor circuits composed of switched capacitor circuits connected at one of their ends to a connection point between said first resistor circuit and said first capacitor element;
second and third capacitor elements connected at one of their ends to the other ends of said second and third resistor circuits and interconnected at their other ends;
fourth and fifth resistor circuits composed of switched capacitor circuits connected at one of their ends to the common connection point at the other ends of said second and third capacitor elements;
fourth and fifth capacitor elements connected at one of their ends to the other ends of said fourth and fifth resistor circuits and interconnected at their other ends;
a sixth resistor circuit composed of a switched capacitor circuit connected between said signal input terminal and the common connection point at the other ends of said fourth and fifth capacitor elements;
a seventh resistor circuit composed of a switched capacitor circuit connected between the common connection point at the other ends of said fourth and fifth capacitor elements and the reference potential point;
eighth and ninth resistor circuits respectively connected at one of their ends to a node between said first resistor circuit and said first capacitor element, and the common connection point at the other ends of said fourth and fifth capacitor elements, being interconnected at their other ends;
a first amplifier circuit connected at the input terminal to a node between said second resistor circuit and said second capacitor element, and at the output terminal to a node between said third resistor circuit and said third capacitor element;
a second amplifier circuit connected at the input terminal to a node between said fourth resistor circuit and said fourth capacitor element, and at the output terminal to a node between said fifth resistor circuit and said first capacitor element;
a third amplifier circuit connected at one end to the common connection point at the other ends of said eighth and ninth resistor circuits;
a tenth resistor circuit composed of a switched capacitor circuit connected between the input and output terminals of said third amplifier circuit; and
a signal output terminal provided at the output terminal of said third amplifier circuit.

9. A switched capacitor filter circuit according to claim 7, in which said first to seventh resistor circuits have positive equivalent resistance.

10. A switched capacitor filter circuit according to claim 8, in which said first to tenth resistor circuits have positive equivalent resistance.

11. A switched capacitor filter circuit according to claim 7, in which at least one of said first to seventh resistor circuits includes: a first switch element supplied at one end with a signal and controlled by a first clock pulse; a second switch element connected at one end to the other end of said first switch element, and at the other end to a reference potential point, and being controlled by a second clock pulse; a third switch element producing a signal at one end and being controlled by said first clock pulse; a fourth switch element connected at one end to the other end of said third switch element and at the other end to the reference potential point, and being controlled by said second clock pulse; and a capacitor element connected to a node between said first and second switch elements and a node between said third and fourth switch elements.

12. As switched capacitor filter circuit according to claim 8, in which at least one of said first to tenth resistor circuits includes: a first switch element supplied at one end with a signal and controlled by a first clock pulse; a second switch element connected at one end to the other end of said first switch element, and at the other end to a reference potential point, and being controlled by a second clock pulse; a third switch element producing a signal at one end and being controlled by said first clock pulse; a fourth switch element connected at one end to the other end of said third switch element, and at the other end to the reference potential point, and controlled by said second clock plsue; and a capacitor element connected to a node between said first and second switch elements and a node between said third and fourth switch elements.

13. A switched capacitor filter circuit according to claim 7, in which at least one of said first to seventh resistor circuits includes: a fifth switch element supplied at one end with a signal and controlled by a first clock pulse; a sixth switch element connected at one end to the other end of said fifth switch element, and being controlled by a second clock pulse, a signal being derived from the other end of said sixth switch element; and a capacitor element connected to a node between said fifth and sixth switch element and the ground potential.

14. A switched capacitor filter circuit according to claim 8, in which at least one of said first to tenth resistor circuits includes: a fifth switch element supplied at one end with a signal and controlled by a first clock pulse; a sixth switch element connected at one end to the other end of said fifth switch element, and being controlled by a second clock pulse, a signal being derived from the other end of said sixth switch element; and a capacitor element connected to a node between said fifth and sixth switch elements and the ground potential.

15. A switched capacitor filter circuit according to claim 7, in which at least one of said first to seventh resistor circuits includes: a seventh switch element supplied at one end with a signal and controlled by a first clock pulse; an eighth switch element, connected at one end to the other end of said seventh switch element, and being controlled by a second clock pulse, a signal being derived from said other end of said eighth switch element; and a capacitor element connected across said eighth switch element.

16. A switched capacitor filter circuit according to claim 8, in which at least one of said first to tenth resistor circuits includes: a seventh switch element supplied at one end with a signal and controlled by a first clock pulse; an eighth switch element connected at one end to the other end of said seventh switch element, and being controlled by a second clock pulse, a signal being derived from said other end of said eighth switch element; and a capacitor element connected across said eighth switch element.

17. A switched capacitor filter circuit according to claim 7, in which at least one of said first to seventh resistor circuits includes: ninth and tenth switch elements supplied at one of their ends with a signal and controlled by first and second clock pulses, respectively; eleventh and twelfth switch elements connected at one of their ends to the other ends of said ninth and tenth switch elements and being controlled by said second and first clock pulses, respectively, a signal being derived from the interconnected other ends of said eleventh and twelfth switch elements; and a capacitance element connected between a node of said ninth and eleventh switch elements and a node of said tenth and twelfth switch elements.

18. A switched capacitor filer circuit according to claim 8, in which at least one of said first to tenth resistor circuits includes: ninth and tenth switch elements supplied at one of their ends with a signal and controlled by first and second clock pulses; eleventh and twelfth switch elements connected at one of their ends to the other ends of said ninth and tenth switch elements and being controlled by said second and first clock pulses, a signal being derived from the interconnected other ends of said eleventh and twelfth switch elements; and a capacitance element connected between a node of said ninth and eleventh switch elements and a node of said tenth and twelfth switch elements.

* * * * *

UNITED STATES PATENT AND TRADEMARK OFFICE
CERTIFICATE OF CORRECTION

PATENT NO. : 4,551,683

DATED : November 5, 1985

INVENTOR(S) : Kenji Matsuo et al.

It is certified that error appears in the above-identified patent and that said Letters Patent is hereby corrected as shown below:

Claim 18, line 5, after "pulses" insert -- respectively --.

Signed and Sealed this

Fifth Day of August 1986

[SEAL]

Attest:

DONALD J. QUIGG

Attesting Officer

Commissioner of Patents and Trademarks